United States Patent [19]

Villers et al.

[11] 3,802,940

[45] Apr. 9, 1974

[54] ENHANCED CONTRAST SEMICONDUCTOR WAFER ALIGNMENT TARGET AND METHOD FOR MAKING SAME

[75] Inventors: Philippe Villers, Concord; Martin A. Allen, Sudbury; James M. Mulvaney, Southboro, all of Mass.

[73] Assignee: Computervision Corporation, Waltham, Mass.

[22] Filed: Jan. 31, 1972

[21] Appl. No.: 222,391

Related U.S. Application Data

[62] Division of Ser. No. 850,883, Aug. 18, 1969, Pat. No. 3,660,157.

[52] U.S. Cl. .................... 148/187, 29/576, 96/36.2, 156/17

[51] Int. Cl. .................... H01l 7/50

[58] Field of Search .............. 148/187; 29/576, 578; 156/17; 96/36.2

[56] References Cited

UNITED STATES PATENTS 3,379,584 4/1968 Bean et al. .......................... 148/175

3,419,956 1/1969 Kren et al. .......................... 29/578

FOREIGN PATENTS OR APPLICATIONS 993,388 5/1965 Great Britain .......................... 148/187

*Primary Examiner*—L. Dewayne Rutledge
*Assistant Examiner*—J. M. Davis
*Attorney, Agent, or Firm*—Chittick, Thompson & Pfund

[57] ABSTRACT

An enhanced contrast semiconductor wafer alignment target for use in automatic, light balanced, null seeking, servo-controlled mask-to-wafer aligners. The target has a line border which differs sharply in its light reflecting characteristic from the surrounding surface of the semiconductor wafer. Within the target area defined by the line border are a plurality of light reflecting and light removing areas arranged, preferably, in alternating sequence to form a checkerboard or parallel line pattern. For semiconductor wafers in which the target cannot be formed in an overlying, electrically insulative layer because of the subsequent removal of the layer, the target is etched directly into the semiconductor materials.

6 Claims, 13 Drawing Figures

ENHANCED CONTRAST SEMICONDUCTOR WAFER ALIGNMENT TARGET AND METHOD FOR MAKING SAME

This is a division of application Ser. No. 850,883 filed on Aug. 18, 1969, now U.S. Pat. No. 3,660,157.

BACKGROUND OF THE INVENTION

This invention relates to the manufacture of semiconductors and, more particularly, to semiconductor wafer alignment targets which are used to align the wafer to an overlying photographic mask.

In the manufacture of semiconductors, the majority of the semiconductor wafers go through a mask alignment operation in which a mask is aligned with respect to one or more alignment targets marked on the wafer. At the present time such alignment operations are typically performed by women operators using high powered microscopes and operator controlled and powered micropositioners. Recent efforts in the industry have been directed toward an automatic mask-to-wafer alignment system using a light balanced, null seeking, servo controlled drive mechanism.

Such light balanced systems require substantial contrast between the target and the semiconductor wafer background to produce a usable positioning error signal. Unfortunately, in the positioning of semiconductor wafers by balancing the light returns from segments of a target area, the processing of the wafer by which the target pattern is applied may result in a low visual contrast target pattern comprising a transparent layer of varying thickness over the specular surface of the semiconductor. Furthermore, in certain manufacturing processes, the normally overlying transparent layer is removed from the semiconductor surface before the next alignment operation leaving only the exposed specular semiconductor surface.

It is accordingly a general object of the present invention to provide an enhanced contrast semiconductor wafer alignment target.

It is a specific object of the invention to provide a wafer alignment target pattern which increases the null sensitivity of automatic, light balanced, null seeking, servo controlled mask-to-wafer aligners.

It is still another object of the invention to provide a method for forming an alignment target directly in the semiconductor material so that subsequently formed patterns of controlled impurities can be positionally referenced to the in situ semiconductor alignment target.

In the accomplishment of these objects, an alignment target pattern area is formed in a transparent layer of material overlying the specular surface of a semiconductor material. The target pattern area has a line border which sharply contrasts with the surrounding background area of the semiconductor when illuminated by either bright field or dark field illumination. Within the target area defined by the line border, are a plurality of light reflecting and light removing areas arranged in alternating sequence to form a pattern. In semiconductor manufacturing operations in which the overlying transparent layer is removed before alignment of the next mask, a target pattern, with or without a line border, is etched directly into the semiconductor wafer.

These objects and other objects and features of the invention will best be understood from the following description of a preferred embodiment thereof, selected for purposes of illustration and shown in the accompanying drawings, in which.

Figures 1, 2, 3:
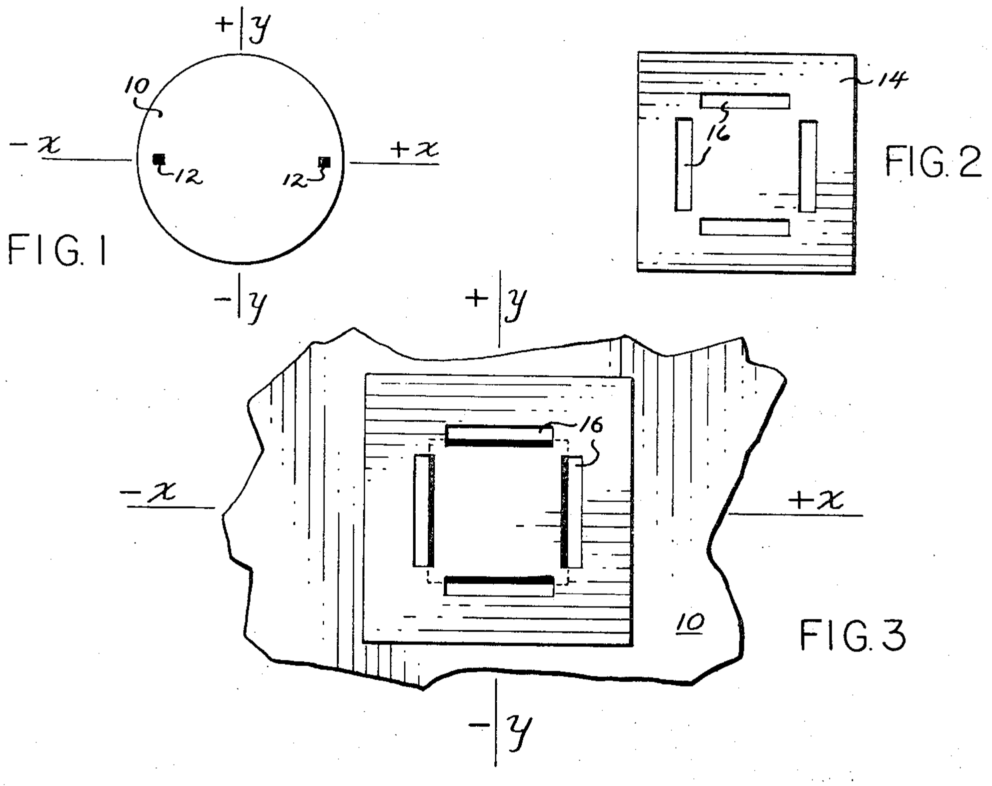
FIG. 1 is a plan view of a semiconductor wafer having two alignment target pattern areas.
FIG. 2 is a plan view of an alignment mask which mates with each of the wafer targets shown in FIG. 1.
FIG. 3 is a plan view showing the mask of FIG. 2 superposed on one of the targets shown in FIG. 1.

Turning now to the drawings, a semiconductor wafer 10 is illustrated in plan view in FIG. 1. The wafer has two alignment target pattern areas 12 located near the edges of the wafer and, preferably, along one of the coordinate axes of the wafer, in this case the "X" axis. In an automatic three-axis, light balanced, null seeking, servo controlled mask-to-wafer aligner, the target pattern areas 12 on the semiconductor wafer are each aligned with respect to an overlying section of a mask 14 (shown in enlarged scale in FIG. 2). A plurality of apertures or windows 16 are located in the mask section so that when the mask and target area are correctly aligned in superposed relation, as shown in FIG. 3, equal portions of the target pattern areas are visible through the mask windows.

Figure 4:
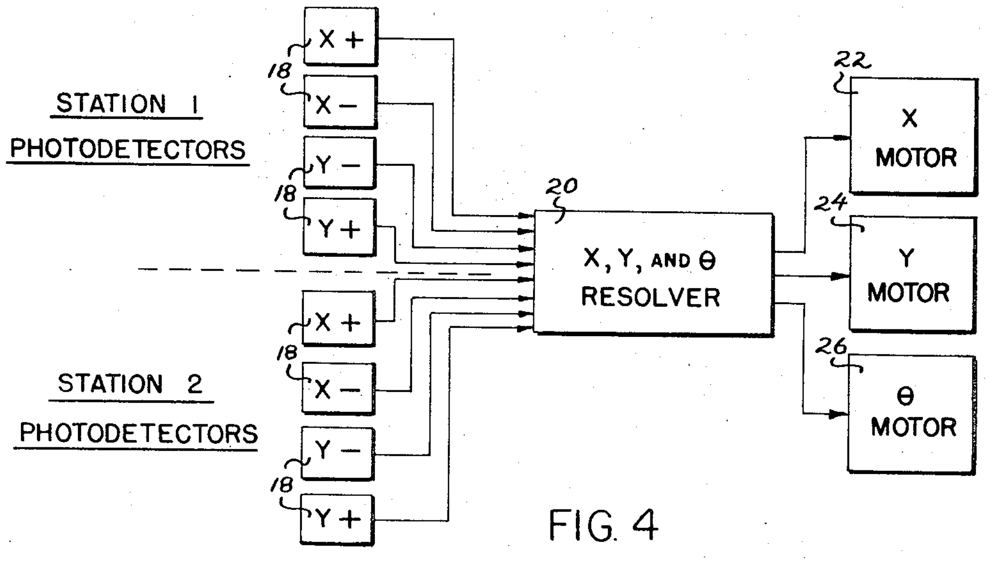
FIG. 4 is a simplified block diagram of an automatic, three-axis, light balanced, null seeking, mask-to-wafer aligner.

A duplicate mask section is superposed over the other wafer target area so that each combination of a target and mask aperture defines an alignment station, identified in the block diagram of FIG. 4 as "Station 1" and "Station 2". To align the semiconductor wafer, the target areas 12 must be accurately positioned with respect to the overlying mask 14. Four photodetectors 18 are provided at each alignment Station to receive the light reflected through the mask aperture windows located on the X and Y coordinate axes. The electrical outputs from the photodetectors at Stations 1 and 2 are combinationally processed in X, Y and $\theta$ resolver 20 to produce X, Y and $\theta$ error position signals. The error signals are used to drive corresponding X, Y and $\theta$ motors 22, 24 and 26, respectively, which are coupled through linkage (not shown) to the semiconductor wafer support (not shown). Each motor drives the wafer in the proper direction to reduce the error signal produced by the associated photodetectors.

Since the alignment system is light balanced and null seeking, it is important to provide a sharp contrast transition between the edge of the target and the surrounding background area. The contrast between the target and wafer background can be enhanced by providing a line border on the target which will produce a sharp, well defined bright or dark line depending upon the type of illumination. For bright field illumination of the target area through the mask windows, the line border will appear dark and, conversely, under dark field illumination the line will appear bright.

Figure 5:
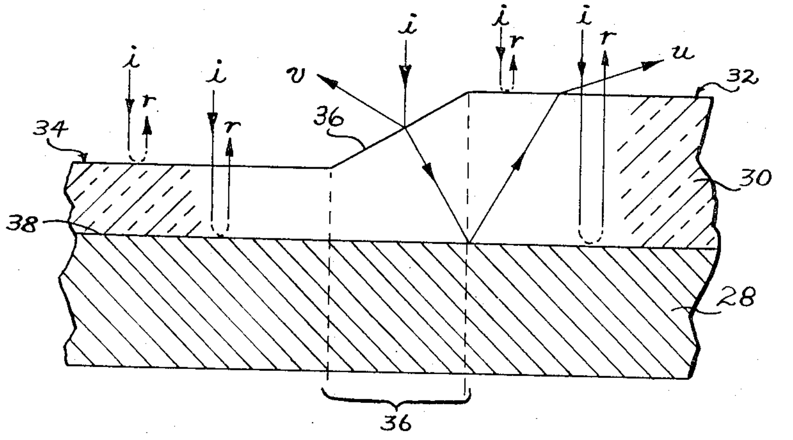
FIG. 5 is a diagrammatic view of a semiconductor wafer and an overlying transparent layer showing the reflection and refraction of normally incident light rays thereon.

The reflection characteristics of the line bordered, alignment target area can be explained by reference to FIG. 5 which illustrates, in diagrammatic form, a semiconductor 28 and on overlying transparent layer 30. The components of FIG. 5 have been shown in correct scale for purposes of clarity. Typically, the semiconductor wafer material 28 is silicon and the overlying transparent layer 30 is silicon dioxide. However, the wafer target contrast enhancement technique of the present invention is applicable to other semiconductor materials, oxides, and combinations thereof. Germanium, for example, is another such semiconductor. The references to silicon and silicon dioxide in this application should be understood to be only illustrative and should not be construed as limiting the invention.

The transparent layer 30 has a two level profile with an upper surface 32, a lower surface 34 and a sloping boundary portion or edge 36. Although the transparent layer 30 is nearly colorless, its refractive index is commonly greater than that of the medium above it. Given the sloping boundary or edge 36, the different refractive index of the overlying medium and the specular surface 38 of the semiconductor at the semiconductor-transparent layer interface, it can be seen that if the target region is illuminated by normally incident light and viewed through an aperture accepting light returned at small angles to the normal, the light incident on boundary 36 will be refracted or reflected away from the normal and the boundary will appear dark. The various ray paths for bright field illumination are shown in FIG. 5 where

*i:* typical incident light
*r:* typical reflected light showing normal return
*v:* typical reflective removal
*u:* typical refractive removal.

Under dark field illumination with the light source at a shallow angle to the surfaces 32 and 34 of the transparent layer 30, it can be seen that light will be reflected from the sloping boundary 36 toward the normal and into the viewing system (not shown). Under such conditions, the boundary 36 will appear as a bright "line".

Figures 6, 6A, 6B:
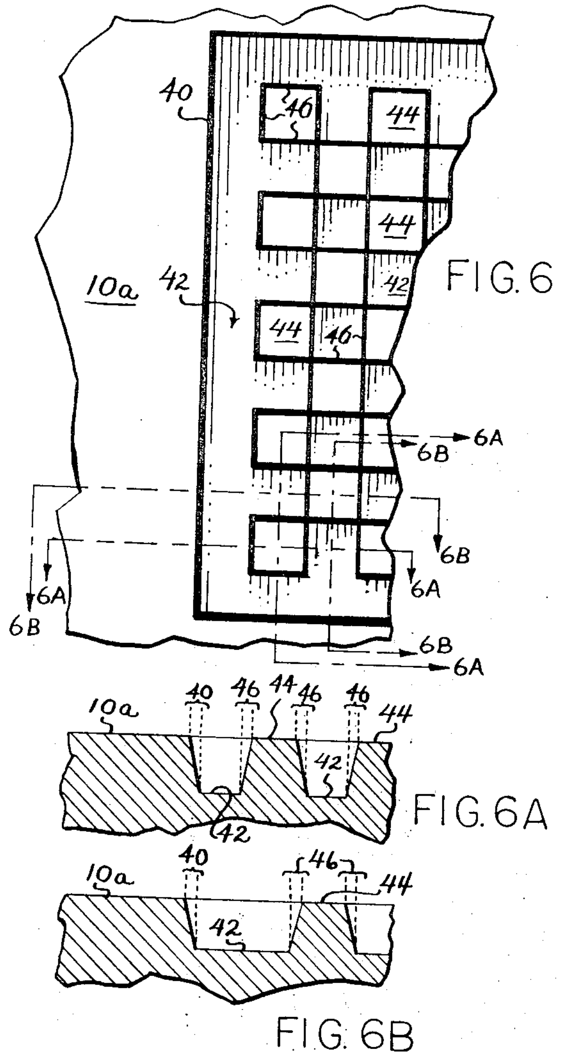
FIG. 6 is an enlarged view of a portion of one of the targets shown in FIG. 1.
FIG. 6A is a view in cross-section taken along line A—A in FIG. 6.
FIG. 6B is a view in cross-section taken along line B—B in FIG. 6.

The sloping boundary or "line" 36 can be used to provide a sharply defined contrast between the edge of the semiconductor wafer target 12 and the surrounding background areas of the semiconductor wafer 10. Looking at FIG. 6, the alignment target area 12 is shown greatly enlarged and, to a limited extent, diagrammatically for purposes of clarity. The cross-sectional views of FIGS. 6A and 6B illustrate the profiled configuration of the target area including a boundary line or edge 40, plateaus and valleys 42 and 44, respectively, and the sloping boundaries or sides 46 between the plateaus and valleys. Under bright field illumination, the target boundary line 40 and the sloping plateaus sides 46 will appear dark while the semiconductor wafer background 10a will appear bright. Conversely, under dark field illumination, the plateaus, valleys and wafer background will appear dark while the boundary line 40 and sloping sides 46 appear bright.

Figure 7:
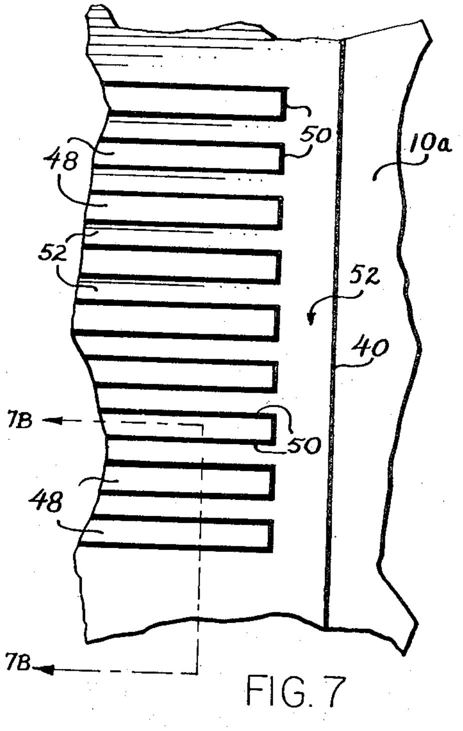
FIG. 7 is an enlarged view of a portion of one of the alignment targets shown in FIG. 1 depicting an alternative target pattern.
Figure 7A:
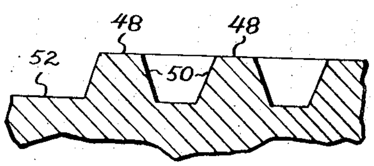
FIG. 7A is a view in cross-section taken along line A—A in FIG. 7.

An alternative embodiment of the particular target area pattern is shown in FIG. 7 in which the line border 40 is combined with a plurality of parallel, light reflecting and light removing areas in the form of parallel ridges 48, sloping sides 50 and valleys 52 which are positioned normal to the line boundary 40. Looking back for a moment to FIG. 3, the ridges and valleys run parallel to the X axis for the target boundary lines visible in the left and right hand mask apertures 16 and parallel to the Y axis for the target boundary lines visible in the top and bottom apertures, as viewed in FIG. 3. One convenient way of separating the two sets of parallel ridges and valleys is to use the diagonals of the target square to form target area quadrants.

The interior of the target area defined by the line borders 40 in FIGS. 6 and 7 produces a low light return, under bright field illumination, because the array of edges or sides (46 in FIG. 6 and 50 in FIG. 7) are so spaced as to maximize the area over which the surface is sufficiently sloped to remove the return from the observation acceptance angle. The array can be in the form of a grid or checkerboard pattern as shown in FIG. 6 or in the form of parallel lines as depicted in FIG. 7. Other patterns can also be used with the line boundary target as long as other pattern configurations produce a corresponding low return area under bright field illumination.

However, it should be noted that whatever pattern is used for the low return areas of the target, the rate of change with target displacement will be proportional to the net sloping area transported into the observed area. Therefore, this rate can be maximized, for a particular direction of motion, by observing the selected area through a slit positioned at right angles to the direction of motion and by defining the target so that a sloping area of the target lies on one boundary of the slits. This "sloping area" in the preferred embodiment is the line boundary 40.

Figure 8:
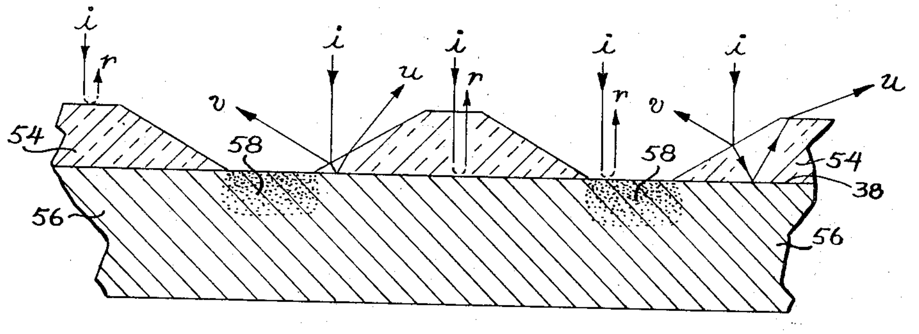
FIG. 8 is a diagrammatic view in cross-section of a semiconductor material and overlying transparent layer showing the reflection and refraction of the light rays normally incident upon the target pattern.

FIG. 8 illustrates the reflective and refractive removal of normally incident light by an overlying transparent layer 54 that has been profiled to form a target pattern area such as the one depicted in FIG. 6. By way of example, the transparent layer 54 can be a layer of silicon dioxide positioned on top of a silicon base 56. Material diffused into the silicon base 56 is shown by the dots and reference numeral 58. The reference numerals used in FIG. 6 to identify the profiled line border, plateaus, valleys and sloping sides of the interior portion of the target pattern are also used in FIG. 8 to identify the corresponding target componets.

Figure 9:
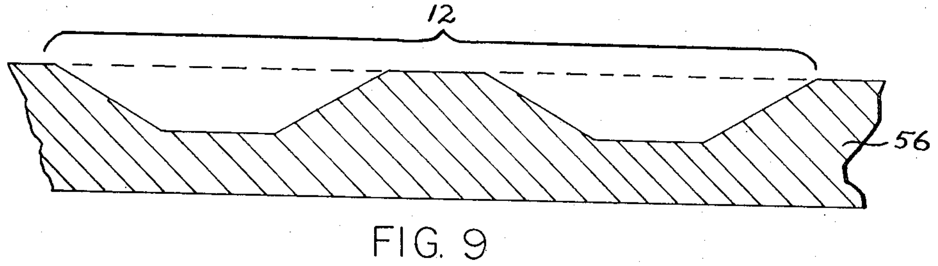
FIG. 9 is a diagrammatic view of a target pattern etched directly into a semiconductor material.

In some semiconductor manufacturing processes, the overlying transparent layer is removed before the next mask alignment operation. Therefore, the target pattern cannot be profiled into the transparent layer. Instead, the target pattern is profiled into the semiconductor material itself, as shown in FIG. 9. There are various ways by which the target pattern area 12 can be formed in the semiconductor material including acid etching, localized ion or electron bombardment and laser erosion, assuming for the latter method sufficient heat toleration by the semiconductor material. Since etching is well established technique in the semiconductor industry, the preferred method for forming the alignment target pattern area in the semiconductor material is by selectively etching the smooth, specular surface of the semiconductor wafer. Commercially available silicon etchants, such as mixtures of hydrofluoric and nitric acid, and the corresponding resists can be used to selectively etch the target pattern areas in a silicon wafer.

Figure 10:
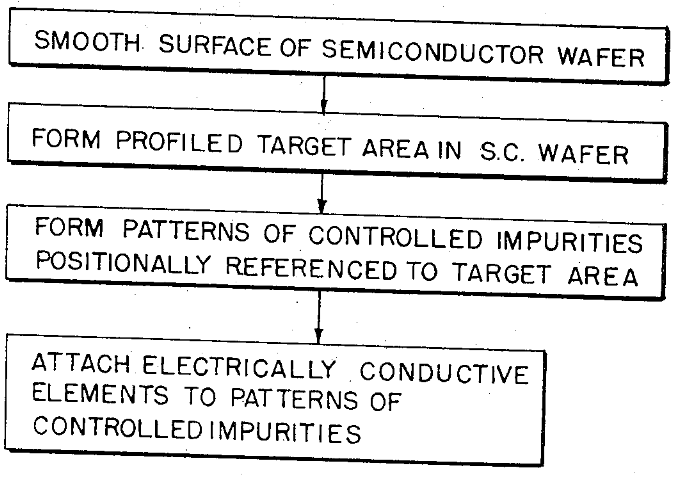
FIG. 10 is a flow plan chart of a method of manufacturing a semiconductor device using the etched semiconductor wafer shown in FIG. 9.

Once the target pattern area has been etched into the semiconductor material, the same target area can be used for a number of mask-to-wafer alignment operations as the successive patterns of controlled impurities are formed in the wafer semiconductor material. Thus each successive pattern of a controlled impurity is positionally referenced to the same alignment target pattern area in the semiconductor wafer. Subsequent attachment of electrically conductive elements to the patterns of controlled impurities at preselected locations thereon can also be controlled by positionally referencing the preselected locations to the target pattern area. The basic steps in this technique are set forth in FIG. 10 in a flow plan block diagram.

It will be appreciated that in automatic mask-to-wafer alignment systems, two target pattern areas, such as shown in FIG. 1, are employed to obtain the necessary alignment accuracy. Both of these target areas can be formed by profiling the target areas in the specular surface of semiconductor material through the use of a suitable etchant. Given two target areas, these areas should be located near the edges of the wafer along a diameter thereof to obtain maximum theta (rotary) positioning information. Subsequent formation of accurately positioned patterns of controlled impurities is achieved by positionally referencing the patterns to the two wafer target areas. In a similar manner, the two target areas are used for positioning reference for the attachment of electrically conductive elements to the patterns of controlled impurities.

Having described in detail a preferred embodiment of our invention, what we claim and desire to secure by Letters Patent of the United States is:

1. Method of manufacturing a semiconductor device comprising the steps of:

1. producing a smooth, specular surface on at least a portion of one side of a wafer of semiconductor material;
2. forming at least one profiled, alignment target pattern area in the smooth, specular surface portion of said wafer by removing semiconductor material from said surface; said alignment target pattern area having
   a line boundary defining at least a portion of the edge of said target pattern area with said line boundary having a contrasting light reflecting characteristic from the specular surface of said wafer and
   a plurality of light relecting and light removing areas located within said target pattern area and adjacent to said line boundary, and
   not being a part of any electrical circuit formed in said semiconductor wafer;
3. forming patterns of controlled impurities in said semiconductor material which are positionally referenced to said alignment target pattern area; and,
4. attaching electrically conductive elements to said patterns of controlled impurities at preselected locations thereon.

2. The method of claim 1 wherein said alignment target pattern area is formed by selectively etching the semiconductor material.

3. The method of claim 1 further characterized by said preselected electrically conductive element attaching locations being positionally referenced to said alignment target pattern area.

4. The method of claim 1 further characterized by forming two spaced, alignment target pattern areas in the smooth, specular surface portion of said wafer and positionally referencing said patterns of controlled impurities to both of said target areas.

5. The method of claim 4 further characterized by positionally referencing said preselected electrically conductive element attaching locations to both of said target areas.

6. The method of claim 4 further characterized by said wafer being generally circular and said two spaced target areas being located near the edges of the wafer along a diameter thereof.

* * * * *